(12) United States Patent
Jin

(10) Patent No.: US 9,496,046 B1
(45) Date of Patent: Nov. 15, 2016

(54) HIGH SPEED SEQUENTIAL READ METHOD FOR FLASH MEMORY

(71) Applicant: Integrated Silicon Solution, Inc., Milpitas, CA (US)

(72) Inventor: Kyoung Chon Jin, San Ramon, CA (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 0 days.

(21) Appl. No.: 14/826,635

(22) Filed: Aug. 14, 2015

(51) Int. Cl.
*G11C 7/00* (2006.01)
*G11C 16/28* (2006.01)
*G11C 16/08* (2006.01)
*G11C 16/24* (2006.01)

(52) U.S. Cl.
CPC ............... *G11C 16/28* (2013.01); *G11C 16/08* (2013.01); *G11C 16/24* (2013.01)

(58) Field of Classification Search
CPC .... G11C 11/4094; G11C 7/12; G11C 11/419
USPC .................................................. 365/189.15
See application file for complete search history.

(56) References Cited

U.S. PATENT DOCUMENTS

| 5,629,892 A | 5/1997 | Tang |
| 6,088,264 A | 7/2000 | Hazen et al. |
| 2001/0017791 A1 | 8/2001 | Funyu et al. |
| 2006/0034140 A1* | 2/2006 | Ogawa .................. G11C 7/065 365/230.03 |
| 2014/0036610 A1* | 2/2014 | Ramamurthy ........... G11C 7/12 365/203 |

* cited by examiner

*Primary Examiner* — Anthan Tran
(74) *Attorney, Agent, or Firm* — Van Pelt, Yi & James LLP

(57) ABSTRACT

A flash memory device implements a sequential read method using overlapping read cycles to initiate the bit-line precharge and equalization operation for a next memory cell address prior to the completion of the read cycle of the current memory cell address. More specifically, the sequential read method implements overlapping read cycle where the bit-line precharge and equalization operation is started for a memory cell of the next address while the memory cell of the current address is being read out. In this manner, the read speed for the sequential read operation of the flash memory device is improved. In some embodiments, the memory cell array for each input-output (I/O) of the flash memory device is partitioned into two sub-banks to further reduce the read cycle time by enabling early activation of the word-line for the next sub-bank.

15 Claims, 11 Drawing Sheets

FIG. 8    (Prior Art)

HIGH SPEED SEQUENTIAL READ METHOD FOR FLASH MEMORY

BACKGROUND OF THE INVENTION

Non-volatile memory (NVM) is a memory device that retains content stored therein even when power is removed. EEPROM and flash memory are two commonly used non-volatile memory devices. In particular, flash memory has become widely used in electronic devices, especially portable electronic devices, because of its ability to provide data storage at low power levels. Modern day flash memory devices are typically implemented using a floating gate MOS transistor device as the memory cells. A floating gate MOS transistor device includes a floating gate that is formed between a control gate and the channel region (the substrate) of the MOS device and at least partially vertically aligned with the control gate. Charge storage on the floating gate determines the stored data state ("0" or "1") of the memory cell.

In a non-volatile memory cell implemented using a floating gate MOS device, programming of the memory cell, or writing data to the memory cell, is accomplished by transferring charge carriers from the semiconductor substrate (the source or the drain) to the floating gate by tunneling through the thin gate oxide layer. Typically, a block of non-volatile memory cells is first erased by applying bias conditions to remove the charges stored on the floating gate. Then, the non-volatile memory cells can be written or programmed, usually one byte or word at a time, by applying the bias conditions opposite to the erase operation. Erase and programming operation of non-volatile memory devices require a relatively large voltage and current.

A flash memory cell is read by applying a gate bias to the control gate and sensing the stored data state on the drain terminal of the flash memory cell, which is coupled to the bit-line of the memory array. To enable fast read access, the sensing of the stored data on the bit-line is typically accomplished using a sense amplifier which compares the current on the bit-line with a reference current. In conventional flash memory devices, the reference current is generated using a reference flash memory cell having the same construction as the flash memory cell in the memory array.

In some applications, a flash memory device may be configured to perform a serial read operation. For example, the flash memory device may be configured to perform a block read or a page read from the memory cell array. In that case, on the receipt of a read command and an initial memory cell address, the flash memory device automatically read out stored data from a block or a page of memory cells starting from the initial memory cell address. In a serial read operation, the memory cells in the block are assessed sequentially to read out the stored data. The flash memory device reads stored data from each memory cell using a ready cycle which starts at the assertion of the Address Transition Detection (ATD) signal on the detection and latching of a memory cell address and ends at the latching of the output data at the sense amplifier output. Then, the memory cell address is incremented and the next read cycle begins.

The speed of the read cycle is limited by the cell current and the loading on the bit-line. To access stored data from a flash memory cell, the selected bit-line is pre-charged and the selected word-line is biased up to the read target voltage. The selected bit-line and the reference bit-line are equalized and then the memory cell is sensed to read out the stored data. The most time consuming part of a read cycle is the time duration required to precharge and equalize the bit-line and the reference bit-line before sensing can take place.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a flash memory device implements a sequential read method using overlapping read cycles to initiate the bit-line precharge and equalization operation for a next memory cell address prior to the completion of the read cycle of the current memory cell address. More specifically, the sequential read method implements overlapping read cycle where the bit-line precharge and equalization operation is started for a memory cell of the next address while the memory cell of the current address is being read out. In this manner, the read speed for the sequential read operation of the flash memory device is improved. Furthermore, in some embodiments, the memory cell array for each input-output (I/O) of the flash memory device is partitioned into two sub-banks to further reduce the read cycle time by enabling early activation of the word-line for the next sub-bank.

Figure 1:
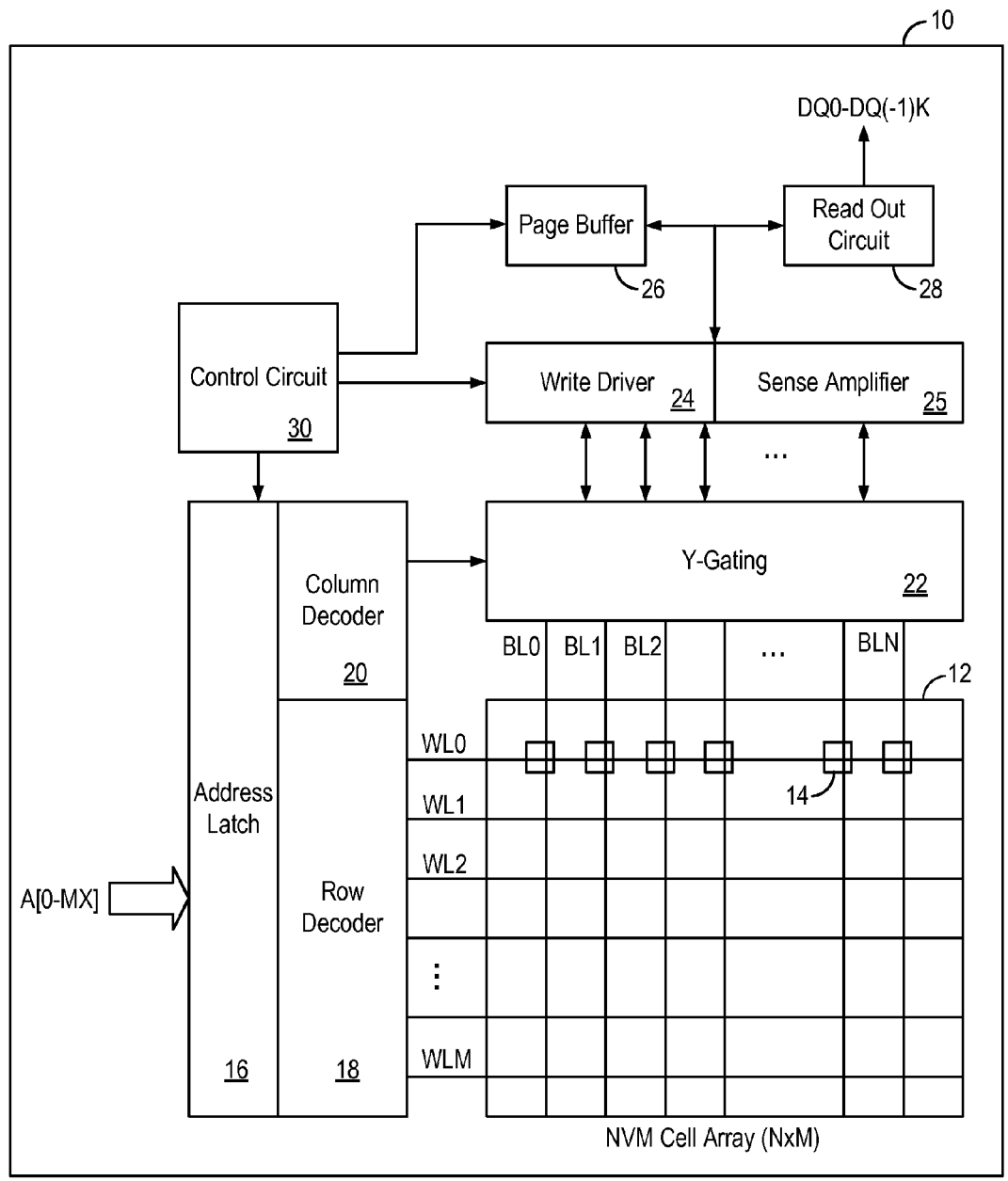
FIG. 1 is a block diagram of a non-volatile memory (NVM) device in one exemplary embodiment.

FIG. 1 is a block diagram of a non-volatile memory (NVM) device in one exemplary embodiment. FIG. 1 is illustrative only and the NVM device may include additional components not shown in FIG. 1. Referring to FIG. 1, the NVM device 10 includes a two-dimensional array 12 of non-volatile memory cells 14. In the present embodiment, NVM device 10 is implemented as a flash memory device and non-volatile memory cells 14 are implemented as flash memory cells. In other embodiments, the NVM device 10 may be implemented as other types of non-volatile memory device.

In embodiments of the present invention, flash memory cells 14 may be configured as a NAND flash memory array or a NOR flash memory array. The memory cell array 12 is addressed by a row decoder 18 and a column decoder 20 to selectively access the memory cells 14 for read, program (write) and erase operations. In particular, an address A[0-MX] is received at an address latch 16 and the received address is decoded by the row decoder 18 which selects the word-lines and the column decoder 20 which selects the bit-lines of the cell array 12. The flash memory cells 14 in the cell array 12 are accessed by word-lines WL0 to WLM and bit-lines BL0 and BLN. The row decoder 18 selectively activates a word-line from WL0 to WLM. The column decoder selectively activates a bit-line from BL0 to BLN through the Y-gating circuit 22 to allow a memory cell 14 at the intersection of the selected word-line and selected bit-line to be accessed. To read data from or write data to the cell array 12, the Y-gating circuit 22 (also referred to as the "bit-line selection circuit") connects the bit-lines to either a write driver circuit 24 or a sense amplifier circuit 25. In practice, the cell array 12 includes multiple banks of memory cells, each bank for each input/output (I/O) of the flash memory device. For example, a flash memory device may have a 16-bit I/O or a 32-bit I/O and thus the cell array 12 of the flash memory device may include 16 or 32 banks of memory cells.

The write driver circuit 24 and the sense amplifier circuit 25 each include a bank of write drivers and sense amplifiers, one set of write driver and sense amplifier for each I/O of the flash memory device. Each set of write driver and sense amplifier is coupled to a bank of memory cells 14 in the cell array 12 designated for the particular input/output (I/O). For example, when the flash memory device 10 generates output data in K-bit (i.e. K-bit I/O), the write driver circuit 24 and the sense amplifier circuit 25 may include K write drivers and K sense amplifiers, each write driver circuit and sense amplifier circuit being coupled to the bank of bit-lines associated with one databit of the output data. The write driver circuit 24 and the sense amplifier circuit 25 may be coupled to a page buffer 26 to receive program data to be written into the cell array 12 and may be further coupled to a read out circuit 28 to provide data read out from the cell array 12 to external circuits. The memory architecture shown in FIG. 1 is illustrative only and it will be appreciated that the structure and methods described herein may be utilized in other memory architectures.

Figure 2:
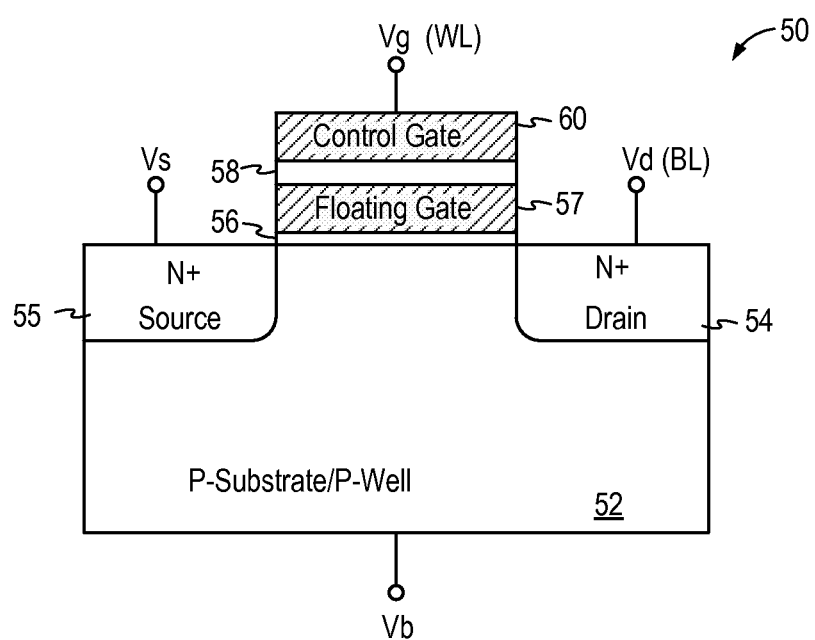
FIG. 2 is a cross-sectional view of a flash memory cell implemented using a floating gate MOS transistor device in some examples of the present invention.

In the present embodiment, flash memory cells 14 are implemented using a floating gate MOS transistor device, as shown in FIG. 2. Referring to FIG. 2, a floating gate MOS transistor device 50 includes a source region 55, a drain region 54, a control gate 60 and a floating gate 57. The source and drain regions are formed in a semiconductor layer 52 with the channel region disposed in between the source and the drain regions. In some examples, the semiconductor layer 52 can be a well region or a semiconductor substrate. In the present example, the floating gate MOS transistor device 50 is formed as an N-type device and the semiconductor layer 52 is a P-type well region with the source and drain regions being heavily doped N+ regions formed in the P-well region 52. The floating gate 57 and the control gate 60 are vertically disposed above the channel region and at least partially overlapped. The floating gate 57 is electrically insulated from the P-type well region 52 by a thin gate oxide layer 56 (also referred to as the "tunnel oxide layer") and is electrically insulated from the control gate 60 by another dielectric layer 58 which can be a dielectric film or a stack of different dielectric films. The control gate 60 of the floating gate MOS transistor device 50 is coupled to the word-line of the cell array while the drain region is coupled to the bit-line of the cell array. In a NOR flash memory, the source regions of the floating gate MOS transistor devices are connected to a shared source line which is typically connected to the ground potential.

In the above-described embodiments, the flash memory cell is formed using a floating gate MOS transistor device where the charge storage floating gate is formed using a polysilicon layer. In other embodiments, other types of floating gate transistor devices can be used to form the flash memory cell. In some embodiments, floating gate transistor devices that are constructed using an insulator as the charge storage floating gate material can be used as the flash memory cell. For example, in some embodiments, the charge storage material can be silicon nitride ($Si_3N_4$) or aluminum oxide ($Al_2O_3$). Thus, in other embodiments, the flash memory cell can be formed as a MNOS (metal-nitride-oxide-semiconductor) memory cell, a MAOS (metal-alumina-oxide-semiconductor) memory cell, a MAS (metal-alumina-semiconductor) memory cell, or a SONOS (silicon-oxide-nitride-oxide-semiconductor) memory cell.

The operation of the flash memory device 10 and the floating gate flash memory cell 50 is well known and will be described in brief. In the present example, the flash memory cell is adapted to store one bit of data. The flash memory cell has a logical state of "1" when the cell is erased and a logical state of "0" when the cell is programmed. It is understood that flash memory cells or the memory cell array may be constructed to operate in the opposite logical states.

First, programming or writing data to the flash memory cell is performed by transferring charge carriers from the semiconductor layer 52 to the floating gate 57 by tunneling through the thin gate oxide layer 56. For example, an elevated gate voltage (e.g. Vg=12V) is applied to the control gate to turn on the channel and electrons can flow from the source to the drain. The P-well region 52 is typically grounded. An elevated drain voltage (e.g. Vd=5V) is applied to the drain region 54 relative to the source region 55 to generate electrons with sufficiently high energy ("hot electrons") so that hot electronic injection occurs and hot electrons jump through the thin gate oxide layer 56 onto the floating gate 57. When the biasing voltages are removed, the charges are trapped on the floating gate 57 and the memory cell is programmed to a logical state of 0.

Second, erasing the flash memory cell is performed by transferring charge carriers from the floating gate to the semiconductor layer 52 (or P-well 52) by quantum tunneling or Fowler-Nordheim tunneling. The erase operation can be carried out using source erase operation or channel erase. To perform source erase, an elevated negative voltage (e.g. Vg=−10V) is applied to the control gate 60 and the substrate is at ground. A positive voltage (e.g. Vd=6V) is applied to the source region 55 with the drain region 54 being grounded or floating. Electrons are pull off the floating gate into the source through quantum tunneling. When the floating gate is left with no charge carriers, the memory cell has a logical state of 1. To perform channel erase, an elevated negative voltage (e.g. Vg=−10V) is applied to the control gate 60 and a positive voltage (e.g. Vb=5V) is applied to the semiconductor layer or P-well 52. The source region 55 and the drain region 54 are left floating. Electrons are pull off the floating gate into the substrate through quantum tunneling. When the floating gate is left with no charge carriers, the memory cell has a logical state of 1.

Flash memory cells can be programmed individually but are usually erased as a block or a sector. Each erase operation includes the application of an erase pulse followed by an erase verify cycle to ensure that all memory cells are indeed erased. If some of the memory cells are not erased, then another erase pulse is applied and the process repeats until all memory cells are erased. In both source erase and channel erase operations, the magnitude and the duration of the voltage bias can vary and are selected to ensure that all memory cells in a sector a block are erased. In most cases, the flash memory device is erased using a repeated erase-verify operation when the memory cells are verified to be erased after an erase cycle and the erase cycle is repeated if not all memory cells are erased.

Finally, a flash memory cell is read by applying a gate voltage that is an intermediate threshold voltage of an erased memory cell (logical "1") and a programmed memory cell (logical "0"). When a flash memory cell is erased, the floating gate carries no charge and the memory cell transistor can be turned on by the application of a first threshold voltage. However, when the flash memory cell is programmed, the negative charge on the floating gate screens the electric field from the control gate, the memory cell transistor thus requires a second threshold voltage higher than the first threshold voltage to turn on. To read a flash memory cell, a gate voltage between the first and second threshold voltages are applied to the control gate and a drain voltage, smaller than the gate voltage, is applied to the drain. If a cell current is measured at the drain terminal, then the memory cell is not programmed and has a logical state of 1. If no cell current is measured at the drain terminal, then the memory cell is programmed and has a logical state of 0.

To access a flash memory cell in the cell array 12, an input address A[0-MX] (FIG. 1) is provided to the flash memory device 10. The input address is latched by the address latch 16 and the latched address is divided into a row address which is coupled to the row decoder 18 and a column address which is coupled to the column decoder 20. Row decoder 18 decodes the row address and activates one word-line out of word-lines WL0 to WLM and column decoder decodes the column address and activates one bit-line out of bit-lines BL0 to BLN. The column decoder activates the bit-lines using the Y-gating circuit 22 (FIG. 1). In this manner, the memory cell associated with the activated word-line and the activated bit-line is made available for either read, write or erase operation. In practice, the flash memory device 10 activates the memory cells associated with all of the I/Os of the memory device, such as a byte of data. For example, the memory cells associated with one byte of data or eight I/Os, may be activated for access based on the input address. More specifically, the flash memory device activates one bit-line in each bank of memory cells associated with a single I/O, each bank being associated one set of write driver and sense amplifier circuit.

In the following description, the operation of the flash memory device is described with reference to a single memory bank for a single I/O, the memory bank being associated with a single write driver circuit and a single sense amplifier circuit. As described herein, references to the "flash memory cell array" may refer to the bank of memory cell array associated with a single I/O. The structures and methods described herein applies to all of the I/Os in the flash memory device and the structures and methods are described with reference to a single I/O for simplicity purpose. It is understood that the flash memory device includes multiple banks of memory cells, one memory cell bank for each I/O and further includes a bank of write drivers and a bank of sense amplifiers, a set of write driver and sense amplifier being associated with a single I/O.

Figure 3:
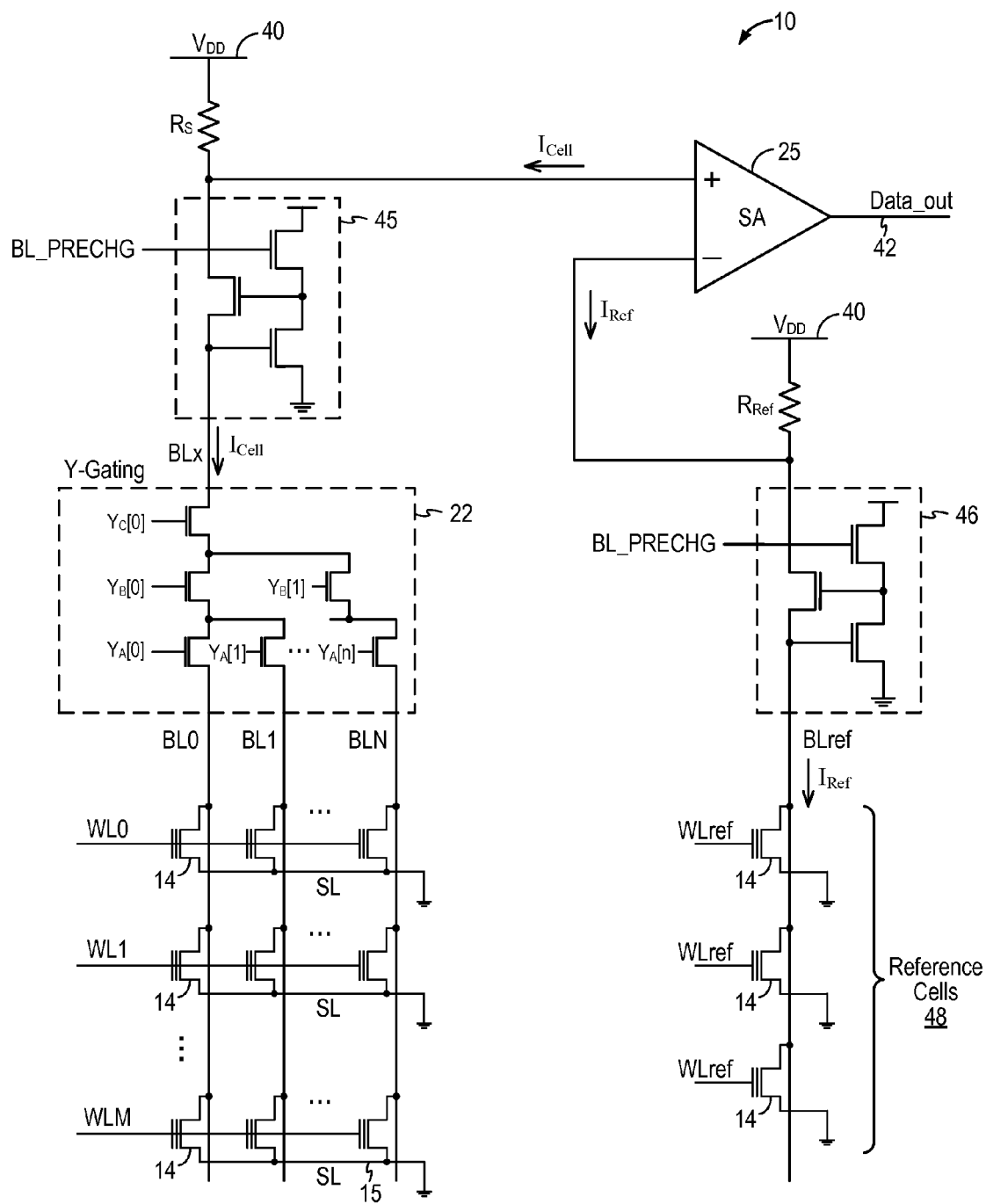
FIG. 3 is a circuit diagram of a portion of the flash memory device of FIG. 1 to illustrate the read operation of the flash memory device in some examples.

FIG. 3 is a circuit diagram of a portion of the flash memory device of FIG. 1 to illustrate the read operation of the flash memory device in some examples. Referring to FIG. 3, in the flash memory device 10, to read out data from a flash memory cell, a memory cell 14 is selected by activating a respective word-line (WLx) and a respective bit-line (BLx) and the cell current that flows in the memory cell is measured. As described above, the word-line WLx is selected by the row decoder (not shown) while the bit-line BLx is selected by a Y-gating circuit 22 controlled by the column decoder (not shown). The source line 15 of the memory cell is connected to ground during the read operation. The cell current $I_{Cell}$ that flows through the memory cell is measured at the drain terminal of the selected memory cell 14 which is coupled to the respective bit-line and then selected by the Y-gating circuit 22 as the bit-line BLx. In the present description, the current that flows through a memory cell when the control gate of the memory cell is biased is referred to as the "cell current" or the "bit-line current."

The amount of cell current that flows through the selected memory cell is a function of the logical state of the memory cell. In some embodiments, if a cell current above a certain threshold, such as 6 µA, is measured at the drain terminal, then the memory cell is erased or is not programmed and has a logical state of 1. On the other hand, if a cell current less than the threshold (e.g. 6 µA) is measured at the drain terminal, then the memory cell is programmed and has a logical state of 0. In some embodiments, the cell current is compared to a reference current $I_{Ref}$ to determine if the cell current is above or below the threshold. In the flash memory device 10, the sense amplifier 25 is configured as a differential amplifier to sense and amplify a difference between the cell current $I_{Cell}$ of the selected flash memory cell 14 and the reference current $I_{Ref}$. In this manner, the cell current of the selected memory cell is compared against the reference current to determine a cell current value above or below the threshold. The sense amplifier generates a sense amplifier output signal Data_out (node 42) indicative of the current differential at its input terminals.

More specifically, the bit-line BLx is connected to a sensing resistor $R_S$ to convert the cell current $I_{Cell}$ to a voltage value. Meanwhile, the reference bit-line BLref is also coupled to a sensing resistor $R_{Ref}$ to convert the reference current $I_{Ref}$ to a voltage value. The sense amplifier 25 compares the voltage value indicative of the cell current $I_{Cell}$ to the voltage value indicative of the reference current $I_{Ref}$. In some embodiments, the sensing resistors $R_S$ and $R_{Ref}$ are implemented using PMOS transistors. The PMOS transistors are biased with appropriate bias voltages to generate the desired loading resistance.

In some examples, the reference current $I_{Ref}$ is generated using a reference current generation circuit including one or more reference flash memory cells 48. The reference flash memory cells 48 are constructed in the same manner as the flash memory cells 14 in the memory array and is biased by a bias voltage WLref to provide the reference current $I_{Ref}$. In operation, the reference current is generated as a ratioed current of an erased flash memory cell, for example, as half of the current of the erased flash memory cell. The reference current, being a half erase cell current, establishes the threshold for the cell current comparison to detect the program state of the selected flash memory state. In examples of the present invention, the ratioed erase cell current can be generated by selecting an appropriate bias voltage WLref or by using a ratioed reference sensing resistor $R_{Ref}$ relative to the bit-line sensing resistor $R_S$.

Prior to the cell current being sensed, the bit-line BLx and the reference bit-line BLref both have to be pre-charged, such as by using precharge circuits 45 and 46 respectively. The bit-lines BLx and BLref are pre-charged and then equalized before sensing of the cell current is carried out. The pre-charge and equalization of the bit-lines are important to enable accurate and speedy sensing of the cell current from the flash memory cells. However, the pre-charge and equalization operation themselves consumes a large portion of the read cycle, limiting the read speed of the flash memory device.

Figure 4:
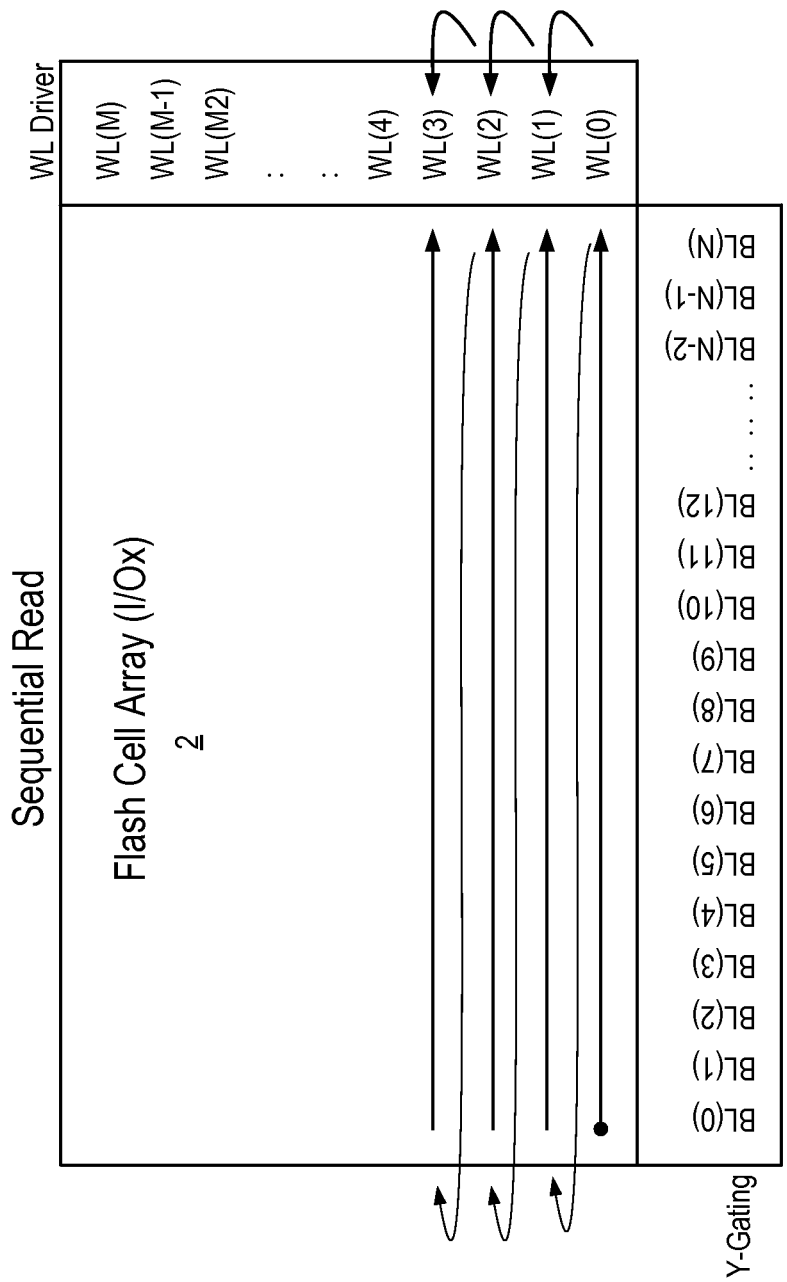
FIG. 4 is a block diagram illustrating the conventional sequential read operation from a memory bank for one I/O of a flash memory device in some examples.

FIG. 4 is a block diagram illustrating the conventional sequential read operation from a memory bank for one I/O of a flash memory device in some examples. Referring to FIG. 4, in some applications, a flash memory device may be operated in a sequential read mode, such as block read or page read mode, where a series of memory cells with consecutive addresses is read sequentially after receiving a starting address or initial address. FIG. 4 illustrates a portion of the cell array of a flash memory device. In particular, FIG. 4 illustrates a bank of the cell array designated for a single I/O, denoted as I/Ox. The flash memory device will include other banks in the cell array designated for other I/Os. The bank of cell array designed for I/Ox is referred to as cell array 2 in the following description.

To perform a sequential read operation, the flash memory device receives an initial address and a read command. In the present example, the initial address is assumed to be the first memory cell in the cell array 2 associated with the first bit-line BL0 and the first word-line WL0. The cell array 2 is read by initializing a first read cycle to read the memory cell at bit-line BL0 and word-line WL0. Then, at each subsequent read cycles, the memory cell address is incremented to read the memory cells having the next consecutive addresses. For example, the sequential read operation will increment the memory cell addresses on the same row WL0 so that the memory cells associated with the first to last bit-lines BL0 to BLN are read out. Then, the sequential read operation increments to the next word-line WL1 and starts reading the memory cell at the first bit-line BL0 and continues to the last bit-line BLN in the cell array 2. The sequential read operation increments the word-line to step through all other address for the read operation.

Figure 5:
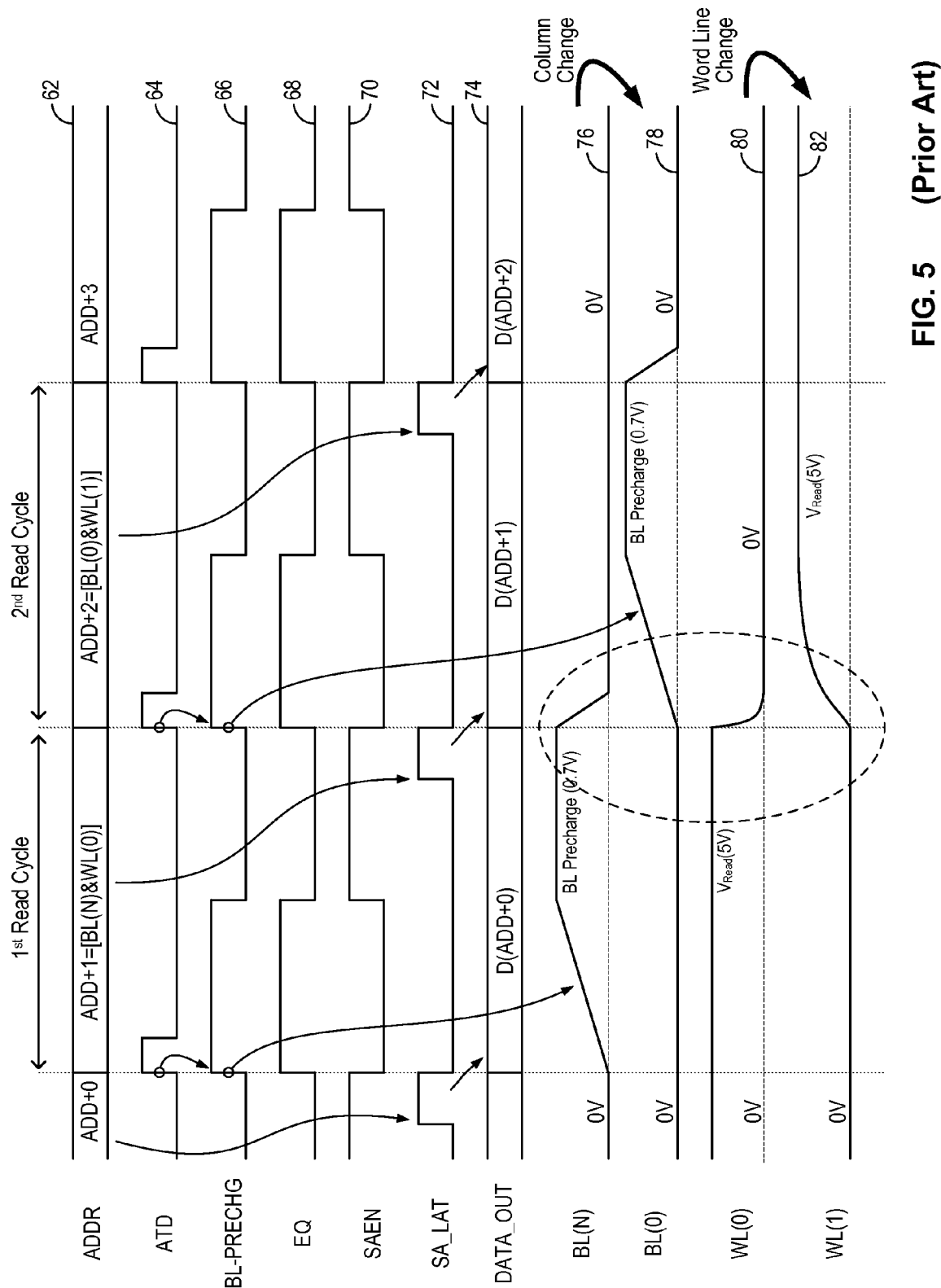
FIG. 5 is a timing diagram illustrating the conventional sequential read operation in the flash memory device of FIG. 4 in some examples.

FIG. 5 is a timing diagram illustrating the conventional sequential read operation in the flash memory device of FIG. 4 in some examples. More specifically, FIG. 5 illustrates several exemplary read cycles during a conventional sequential read operation in the flash memory device. As described above, in a sequential read operation, the flash memory device receives the initial address with the read command. The flash memory device performs the sequential read operation by starting at the initial memory cell address and incrementing to the next consecutive memory cell address at each read cycle until the entire block or page of memory cells have been read out. In some examples, the flash memory device may include a counter circuit to increment the memory cell address based on the initial address.

The flash memory device reads stored data from each memory cell using a read cycle which starts at the assertion of the Address Transition Detection (ATD) signal on the detection and latching of a memory cell address and ends at the latching of the output data at the sense amplifier output. Then, the memory cell address is incremented and the next read cycle begins. In FIG. 5, several read cycles in the intermediate stage of the sequential read operation are described.

Referring to FIG. 5, the sequential read operation has processed a previous address ADD+0 (curve 62). At the end of the previous read cycle, the sense amplifier output latch signal SA_LAT is asserted to latch out the data for address ADD+0. The data for address ADD+0 will thus be valid at the next clock cycle which starts the next read cycle. In the next read cycle (the first read cycle), the sequential read operation increments the memory cell address to ADD+1 (curve 62). Address ADD+1 is assumed to be the memory cell address for the memory cell at the last bit-line BL(N) of the first word-line WL(0) which is the last memory cell in the first row WL(0), as shown in FIG. 4. When the arrival of the new address ADD+1 is detected, the address transition detection ATD signal is triggered (curve 64). With the triggering of the ATD signal, all internal timing for the read operation is defined. More specifically, the precharge operation, the sensing of the memory cell data and the latching of the output data are all triggered off the ATD signal.

With the ATD signal asserted, the bit-line precharge signal BL-PRECHG is asserted to start the precharging of the bit-line associated with the current address (curve 66). The Y-gating circuit 22 (FIG. 4) is activated by the column decoder to select a bit-line associated with the current address. Accordingly, the bit-line BL(N) (curve 76) is selected and starts to be charged up to the precharge voltage. In the present example, the precharge voltage is 0.7V. Meanwhile, the reference bit-line BLref is also precharged. The equalization signal EQ is asserted to equalize the selected bit-line BL(N) with the reference bit-line BLref (curve 68). Furthermore, at the triggering of the ATD signal, the word-line associated with the current address is also activated. In the present illustration, because the current address ADD+1 is on the same row as the previous address ADD+0, the word-line WL(0) (curve 80) has been previously activated to the read voltage $V_{Read}$ by the word-line driver (FIG. 4) and thus the word-line WL(0) will remain activated at the read voltage $V_{Read}$ of 5V.

After the selected bit-line is precharged, the precharge signal BL-PRECHG and the equalization signal EQ are deasserted. Then the sense amplifier enable signal SAEN is asserted (curve 70) and the sense amplifier output latch signal SA_LAT (curve 72) is asserted to latch the output signal associated with the current address ADD+1. The data out signal (curve 74) for the current address ADD+1 will be valid at the next read cycle.

The next read cycle (the second read cycle) starts with the detection of the next address ADD+2 and the triggering of the ATD signal. The next address in this case is the memory cell address for the first memory cell on the next row—that is, at bit-line BL(0) and word-line WL(1), as shown in FIG. 4. The second read cycle proceeds in the same manner as described above with reference to first read cycle with the precharging of the bit-line BL(0) (curve 78) and equalizing of the bit-line BL(0) the reference bit-line BLref. However, in this case, because the word-line has moved from the first word-line WL(0) to the second word-line WL(1), the first word-line WL(0) needs to be deactivated while the second word-line WL(1) needs to be charged up to the read voltage $V_{Read}$. The output signal associated with the current address ADD+2 is latched when the sense amplifier output latch signal SA_LAT is asserted.

In the conventional sequential read operation, the speed of the read cycle is limited by the bit-line precharge time and the word-line activation time, as indicated by the dotted circle in FIG. 5. Referring to FIG. 5, the read cycle includes the bit-line precharge time to provide a sufficient time period for the selected bit-line to precharge. Furthermore, at the boundary condition when the read cycle moves to the next row in the cell array, the read cycle also must include a time period to allow the previously activated word-line to be discharged before activating the currently selected word-line. Accordingly, the conventional sequential read operation tends to be slow.

In embodiments of the present invention, a flash memory device implements a sequential read method using overlapping read cycles to initiate the bit-line precharge and equalization operation for a next memory cell address prior to the completion of the read cycle of the current memory cell address. In this manner, the flash memory device is capable of achieving high read speed in sequential read operations. Furthermore, in some embodiments, the flash memory device further implements the sequential read method using split word-lines to enable early word-line activation. Further improvement in the read speed is realized by reducing the word-line activation time at the boundary conditions.

In the present description, "sequential read" or a "sequential read operation" of a flash memory array refers to accessing and reading data from a series of memory cells having consecutive memory cell addresses. The sequential read operation is initiated by a read command indicating sequential read mode and an initial address. The flash memory device begins reading the memory cell at the initial address and increments the memory cell addresses based on the initial address until the selected memory cells have been accessed and read. For example, the sequential read operation may be directed for a block of memory cells (block read mode) or a page of memory cells (page read mode). The selected memory cells typically includes memory cells from all of the columns and from multiple rows of the cell array. In a sequential read operation, only the initial address is provided with the read command to the flash memory device. In some embodiments, the flash memory device includes a counter circuit to increment the memory cell address to generate the consecutive memory cell addresses for subsequent read cycles.

Figure 6:
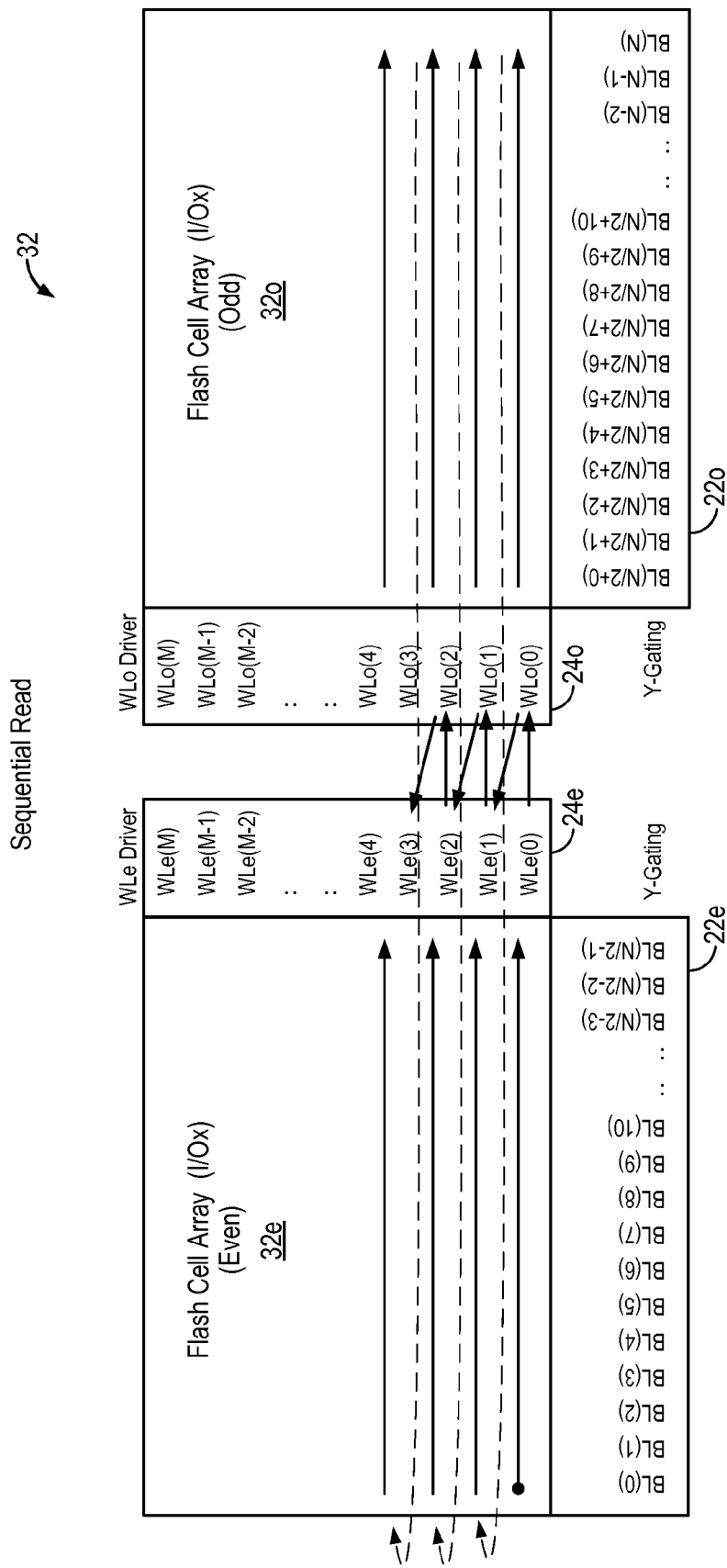
FIG. 6 is a block diagram illustrating a memory bank for one I/O of a flash memory device configured with split word-lines which can be used to implement the early word-line activation feature of the sequential read method in some embodiments of the present invention.

FIG. 6 is a block diagram illustrating a memory bank for one I/O of a flash memory device configured with split word-lines which can be used to implement the early word-line activation feature of the sequential read method in some embodiments of the present invention. Referring to FIG. 6, to enable early word-line activation, a memory cell array 32 for an input-output (I/O) of a flash memory device is partitioned into two sub-banks (even and odd) 32e and 32o. FIG. 6 illustrates a bank cell array 32 designated for a single I/O, denoted as I/Ox. In practice, the flash memory device will include other banks of cell arrays designated for other I/Os.

Referring to FIG. 6, in some embodiments, the memory cell array 32 for I/Ox is partitioned into two sub-banks 32e and 32o. Each sub-bank being driven by a word-line driver 24e or 24o. Accordingly, a word-line at one sub-bank, such as even sub-bank 32e, may be activated while a different word-line at the other sub-bank, such as odd sub-bank 32o, is also activated. In this manner, when the memory cells in one row of a sub-bank are being read, the word-line for the next row in the other sub-bank may be activated in anticipation of the next read cycle. In particular, the word-line for the next row can be activated without waiting for the word-line for the current row to be deactivated as the two word-lines will be in different sub-banks Such early activation of the word-line enables reduction of the read cycle time, thus increasing the read speed in a sequential read operation.

To perform a sequential read operation using the spilt word-line cell arrays 32e and 32o, the flash memory device receives an initial address and a read command. In the present embodiment, the initial address is assumed to be the first memory cell in the cell array 32 associated with the first bit-line BL(0) and the first word-line WL(0). Thus, the memory cells in the even sub-bank 32e are first read out and the word-line WLe(0) is first activated. The cell array 32e is read by starting at the initial address and the incrementing the cell address to read all the memory cells on the same row, from the first BL(0) to the last bit-line BL(N/2−1) in the even sub-bank 32e. When the last memory cell in the even sub-bank 32e is being read, word-line WLo(0) is activated so that when the sequential read operation moves to the memory cells in the odd sub-bank 32o, the word-line WLo(0) is already activated. The read operation continues in the odd sub-bank 32o with reading of the memory cells from bit-line BL(N/2+0) to BL(N).

When the last memory cell in the odd sub-bank 32o is being read, the flash memory device can prepare the next row of memory cells for access. Thus, the sequential read operation can activate the next word-line WLo(1) in the even sub-bank 32e so that when the sequential read operation moves to the memory cells in the new row in the even sub-bank 32e, the word-line WLe(1) is already activated. The read operation continues in the even sub-bank 32e with reading of the memory cells from bit-line BL(0) to BL(N/2−1). The sequential read operation proceeds as described above to read all of the memory cells from the array 32 designated for the current read operation.

With the memory cell array 32 thus configured with split word-lines, the read cycle time can be shortened by saving the word-line set-up time at the boundary condition of changing to a new row or new word-line. The read cycle can proceed without having to wait for a previous word-line to discharge and for the current word-line to charge up. Because the word-line is coupled to a row of memory cells, the RC time constant for charging up a word-line can be long. By splitting up the word-line for a row into two segments and enabling early word-line activation, the word-line for the next row can be ready when the read cycle starts without waiting for the word-line set-up time.

While the split word-line configuration enables the use of early word-line activation in the sequential read method of the present invention, the split word-line configuration is optional and may be omitted in some embodiments of the present invention. The sequential read method of the present invention may be implemented with or without early word-line activation. Early word-line activation provides particular advantages in the sequential read method of the present invention as the sequential read method uses overlapping read cycles to precharge the bit-line early for the next read cycle. Therefore, it would be advantageous to have the word-line also be activated early for the next read cycle so that the read speed is improved for reading of all memory cells in the array, including the memory cells at the boundary condition of switching to a new row or new word-line.

Figure 7:
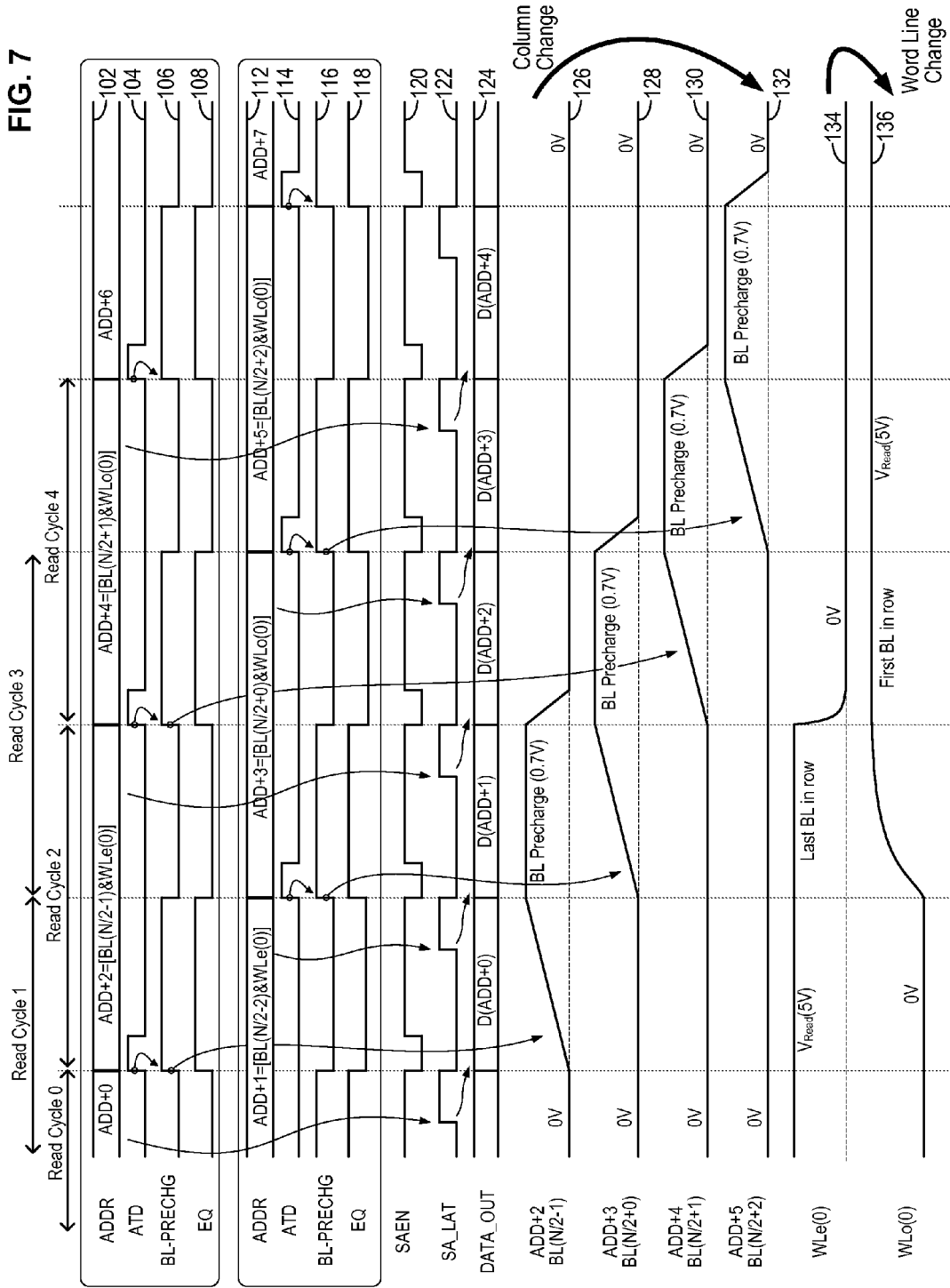
FIG. 7 is a timing diagram illustrating a sequential read method in embodiments of the present invention.

FIG. 7 is a timing diagram illustrating a sequential read method in embodiments of the present invention. More specifically, FIG. 7 illustrates several exemplary read cycles during the sequential read method of the present invention operating in the flash memory device of FIGS. 1 and 6. In the sequential read method, the flash memory device receives the initial address with the read command indicating sequential read mode. The flash memory device performs the sequential read method by starting at the initial memory cell address and incrementing to the next consecutive memory cell address at each read cycle until the entire block or page of memory cells have been read out. In some examples, the flash memory device may include a counter circuit to increment the memory cell address based on the initial address.

Referring to FIG. 7, the sequential read method implements overlapping read cycle where the bit-line precharge and equalization operation is started for a memory cell of the next consecutive address while the memory cell of the current address is being read out. By performing the precharging operation in advance, the read speed can be increased. For example, when the advance precharge operation is started halfway through the previous read cycle, the read speed can be doubled by saving the precharge time for each read cycle.

In the sequential read method, a read cycle starts at the assertion of the Address Transition Detection (ATD) signal on the detection and latching of a memory cell address and ends at the latching of the output data at the sense amplifier output. Then, the memory cell address is incremented and the next read cycle begins. In FIG. 7, several read cycles in the intermediate stage of a sequential read operation are described. Furthermore, in the present description, the memory array is assumed to have the split word-line configuration shown in FIG. 6. The use of the split word-line configuration is optional and may be omitted in other embodiments of the present invention.

In FIG. 7, at a read cycle 0, the sequential read method has processed a previous address ADD+0 (curve 102). The address ADD+0 is an address for a memory cell in the even sub-bank 32e on the first row WLe(0) of the memory array. At the end of the read cycle 0, the sense amplifier output latch signal SA_LAT (curve 122) is asserted to latch out the data for address ADD+0. The data for address ADD+0 will thus be valid at the next clock cycle which starts the next read cycle. Meanwhile, while the read cycle 0 for address ADD+0 is still in progress, the address for the next read cycle 1 for address ADD+1 (curve 112) is provided in advance and the bit-line precharge signal BL-PRECHG (curve 116) and the equalization signal EQ (curve 118) are asserted to precharge the bit-line associated with address ADD+1, which is bit-line BL(N/2−2) (FIG. 6). The precharge of the bit-line BL(N/2−2) for address ADD+1 is completed when the read cycle 0 is completed so that the sense amplifier enable signal SAEN (curve 120) and the sense amplifier output latch signal SA-LAT (curve 122) can be asserted at the second half of the read cycle 1 to read out the stored data for address ADD+1. During the read cycles 0 and 1, the word-line WLe(0) (curve 134) is already activated to the read voltage $V_{Read}$ as sequential read has been performed for the bit-lines on the same row WLe(0) in prior read cycles.

Again, while the read cycle 1 for address ADD+1 is still in progress, the address for the next read cycle ADD+2 (curve 102) is provided in advance and the ATD signal (curve 104) is triggered for address ADD+2. The bit-line precharge signal BL-PRECHG (curve 106) and the equalization signal EQ (curve 108) are asserted to precharge the bit-line associated with address ADD+2, which is bit-line BL(N/2−1) (FIG. 6). Bit-line BL(N/2−1) (curve 126) is thus precharged during the first half of read cycle 2 which overlaps the second half of read cycle 1. BL(N/2−1) is the last bit-line in the even sub-bank 32e of the memory array.

At the end of read cycle 1 and with the sense amplifier output latch signal SA_LAT (curve 122) asserted to latch the output data for the address ADD+1, read cycle 2 can proceed to sense the output data at the memory cell at address ADD+2. The bit-line precharge signal BL-PRECHG (curve 106) and the equalization signal EQ (curve 108) are deasserted. The sense amplifier enable signal SAEN (curve 120) is asserted and the sense amplifier output latch signal SA-LAT (curve 122) is also asserted at the second half of the read cycle 2 to read out the stored data for address ADD+2.

Similar to previous read cycles, while the read cycle 2 for address ADD+2 is still in progress, the address for the next read cycle 3 for address ADD+3 (curve 112) is provided in advance and the ATD signal (curve 114) is triggered for address ADD+3. The bit-line precharge signal BL-PRECHG (curve 116) and the equalization signal EQ (curve 118) are asserted to precharge the bit-line associated with address ADD+3, which is bit-line BL(N/2+0) being the first bit-line in the odd sub-bank 32o of the memory array. Bit-line BL(N/2+0) (curve 128) is thus precharged during the first half of read cycle 3 which overlaps the second half of read cycle 2. BL(N/2+0), being the first bit-line in the odd sub-bank 32o of the memory array, will require the word-line WLo(0) to be activated and charge up to the read voltage $V_{Read}$ (e.g. 5V) in preparation of the sensing of the memory cell. In embodiments of the present invention, by splitting the word-lines into an even segment for the even sub-bank and an odd segment for the odd sub-bank, the word-line WLo(0) for the next read cycle can be set up in advance, without waiting for the previous word-line to be discharged. Thus, during the second half of the read cycle 2, the word-line WLo(0) is charged up to the read voltage $V_{Read}$.

At the end of read cycle 2 and with the sense amplifier output latch signal SA_LAT (curve 122) asserted to latch the output data for the address ADD+2, read cycle 3 can proceed to sense the output data at the memory cell at address ADD+3. The bit-line precharge signal BL-PRECHG (curve 116) and the equalization signal EQ (curve 118) are deasserted. The sense amplifier enable signal SAEN (curve 120) is asserted and the sense amplifier output latch signal SA-LAT (curve 122) is also asserted at the second half of the read cycle 3 to read out the stored data for address ADD+3. Note that by the second half of the read cycle 3, the word-line WLo(0) is already charged up so that no delay for word-line set up is necessary.

The sequential read method proceeds as described above with overlapping read cycles to precharge and equalize the bit-lines for the next read cycle in advance. In this manner, the set up time for bit-line precharge is eliminated and the read speed for the sequential read operation is improved. Furthermore, when a split word-line configuration is used, the sequential read method can proceed with early word-line activation to activate the word-lines for the next row in advance. In this manner, the set up time for charging up the word-line is eliminated and the read speed for the sequential read operation is improved.

When the memory array uses the split word-line configuration, the sequential read method of the present invention can implement different methods for word-line activation. In the above described embodiment, each word-line segment is activated in turn. For example, the word-line segment WLe(0) for the even sub-bank is activated to read the bit-lines in the even sub-bank. When the last bit-line in the even sub-bank is reached, the word-line segment WLo(0) for the odd sub-bank is activated in advance for the next read cycle. Again, when the last bit-line in the odd sub-bank is reached, the word-line segment WLe(1) for the next row in the even sub-bank is activated in advance for the next read cycle. This process continues to activate the word-line segment for each sub-bank in turn for early word-line activation. Accordingly, there is no delay in reading the first bit-line in either sub-bank as the word-line segment is already activated.

In other embodiments, both word-line segments of the same row can be activated at the same time. For example, the word-line segment WLe(0) for the even sub-bank and the word-line segment WLo(0) for the odd sub-bank can both be activated at the same time. At a certain read cycle at or before the last bit-line of the first row WLo(0) in the odd sub-bank is read, the word-line segment WLe(0) can be discharged and the next word-line segment WLe(1) can be activated. In this manner, when the read cycle reaches the last bit-line of the first row WLo(0) in the odd sub-bank, the sequential read method can continue to read the first bit-line of the next row WLe(1) in the even sub-bank. Again, at a certain read cycle at or before the last bit-line of the second row WLe(1) in the even sub-bank is read, the word-line segment WLo(0) can be discharged and the next word-line segment WLo(1) can be activated. Accordingly, there is no delay in reading the first bit-line in the second row WLo(1) as the word-line segment is already activated.

In yet another embodiment, both word-line segments of the same row can be activated at the same time and the memory cells are read alternately from each sub-bank. That is, an entire word-line WLe(0) and WLo(0) can be activated and memory cells are read alternately from the even sub-bank and then the odd sub-bank. When the last bit-line in the first word-line is reached in the odd sub-bank, the word-line segment for the current row for the even sub-bank is discharged and the word-line segment for the next row WLe(1) in the even sub-bank is activated. After reading of the last bit-line of the first word-line in the odd sub-bank is completed, the word-line segment of the first word-line in the odd sub-bank can now be discharged and the word-line segment for the next row WLo(1) in the odd sub-bank can be activated.

In the case that a split word-line configuration is not used, the sequential read operation can be implemented by providing word-line setup time for boundary condition when the address proceeds to a new row in the cell array.

Figure 8:
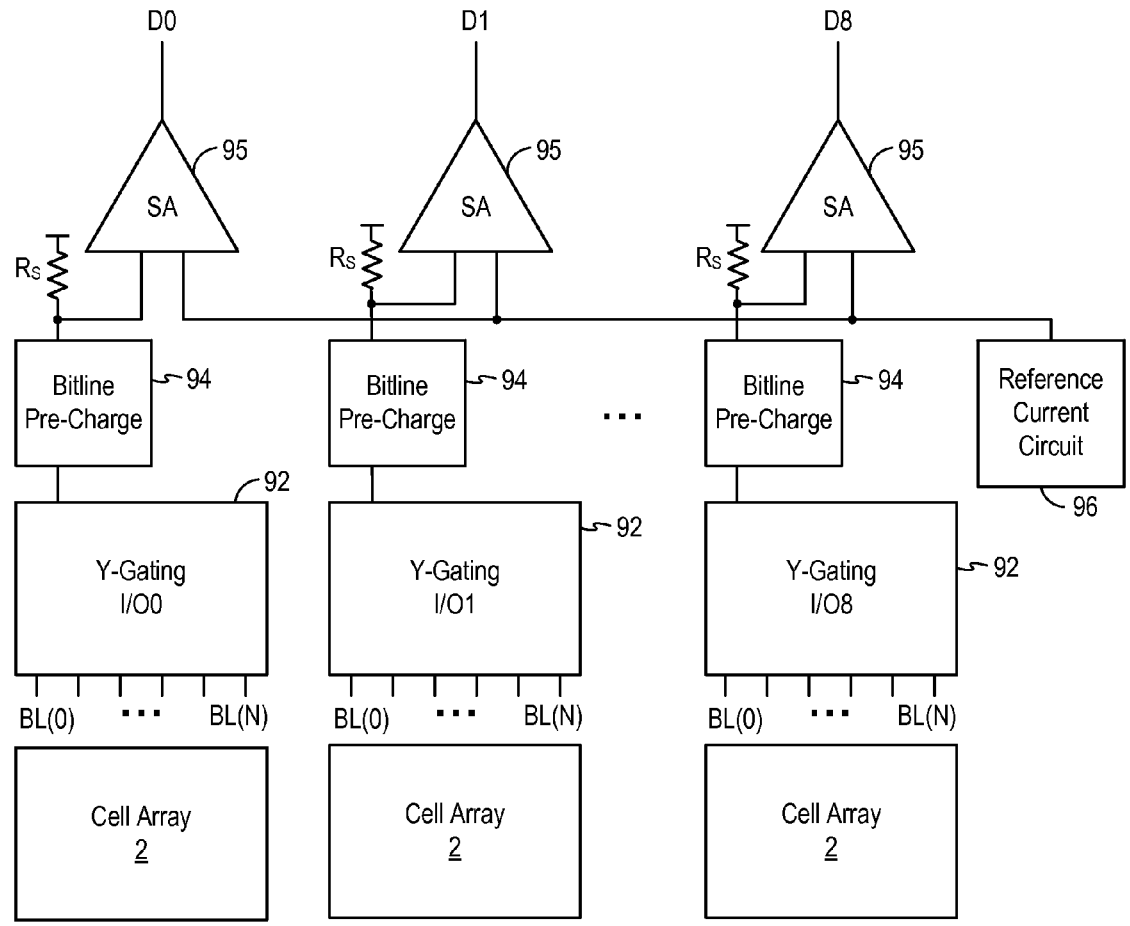
FIG. 8 is a block diagram illustrating a configuration of a conventional flash memory device related to the read operation in some examples.

FIG. 8 is a block diagram illustrating a configuration of a conventional flash memory device related to the read operation in some examples. Referring to FIG. 8, in a conventional flash memory device, each I/O is configured with a cell array 2, coupled to a Y-gating circuit 92, which is coupled to a bit-line precharge circuit 94, which is then coupled to a sense amplifier 95. Thus, in the example shown, when the flash memory device has an 8-bit I/O D0 to D8), eight sets of sense amplifier/precharge circuit/Y-gating circuit/cell array are provided. The flash memory device typically includes a reference current circuit 96 coupled to the sense amplifier for all the I/Os of the flash memory device.

Figure 9:
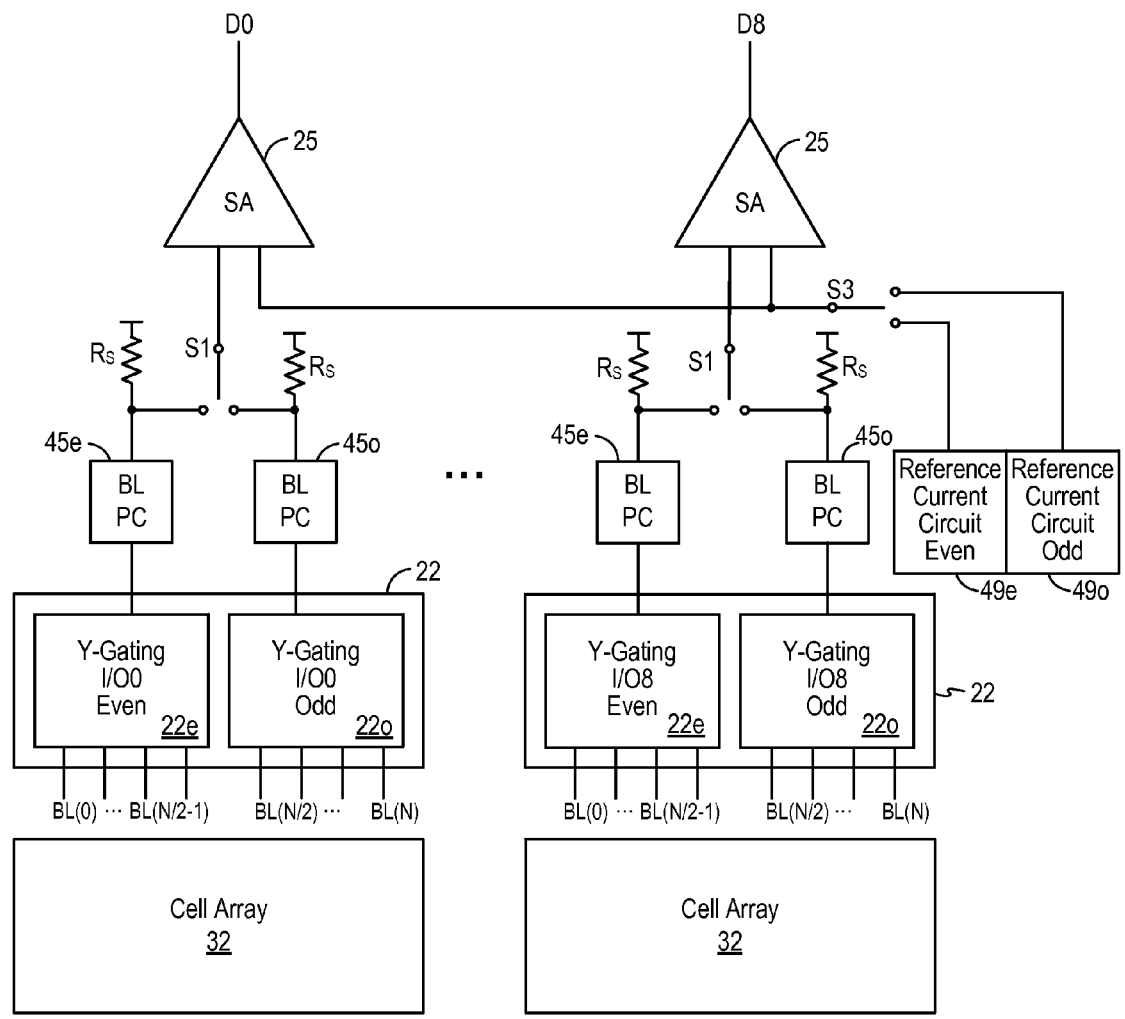
FIG. 9 is a block diagram illustrating a configuration of a flash memory device for implementing the sequential read method in embodiments of the present invention.

In some embodiments, to implement the sequential read method of the present invention with overlapping read cycle performing advance bit-line precharge, the flash memory device of the present invention is configured with additional bit-line precharge circuits to enable the advance bit-line precharge. FIG. 9 is a block diagram illustrating a configuration of a flash memory device for implementing the sequential read method in embodiments of the present invention. Referring to FIG. 9, a flash memory device of the present invention configured to implement the sequential read method uses a pair of bit-line precharge circuits for each I/O. More specifically, each I/O is configured with a cell array 22, coupled to a Y-gating circuit 22, which is coupled to a bit-line precharge circuit 45, which is then coupled to a sense amplifier 25. In particular, for each I/O, the Y-gating circuit 22 is partitioned into an even Y-gating circuit section 22e and an odd Y-gating circuit section 22o. Each section 22e, 22o of the Y-Gating circuit 22 is coupled to a dedicated bit-line precharge circuit 45e, 45o. In this manner, the flash memory device can be operated with overlapping read cycles to allow one bit-line to be sensed while another bit-line to be precharged. A switch S1 connects the bit-line associated with the current address to the first input terminal of the sense amplifier 25. The switch S1 switches between read cycles to sense the cell current from the bit-line associated with the current address.

To accommodate the overlapping read cycles, the flash memory device of the present invention is further incorporated with a pair of reference current circuits, including an even reference current circuit 49e and an odd reference current circuit 49o. Each reference current circuit 49e, 49$_o$ generates a reference current to be compared with the cell current. Because the reference bit-line in the reference current circuit 49 also needs to be precharged and equalized with the selected bit-line, a pair of the reference current circuit 49e, 49$_o$ is provided so that one reference current circuit is coupled to the current address for sensing while the other reference current circuit is being precharged and equalized with the advance address. A switch S3 connects the reference current circuits 49e, 49$_o$ to the second input terminal of the sense amplifier 25. The switch S3 switches between read cycles to connect the reference bit-line associated with the current address to the second input terminal of the sense amplifier 25.

Figure 10:
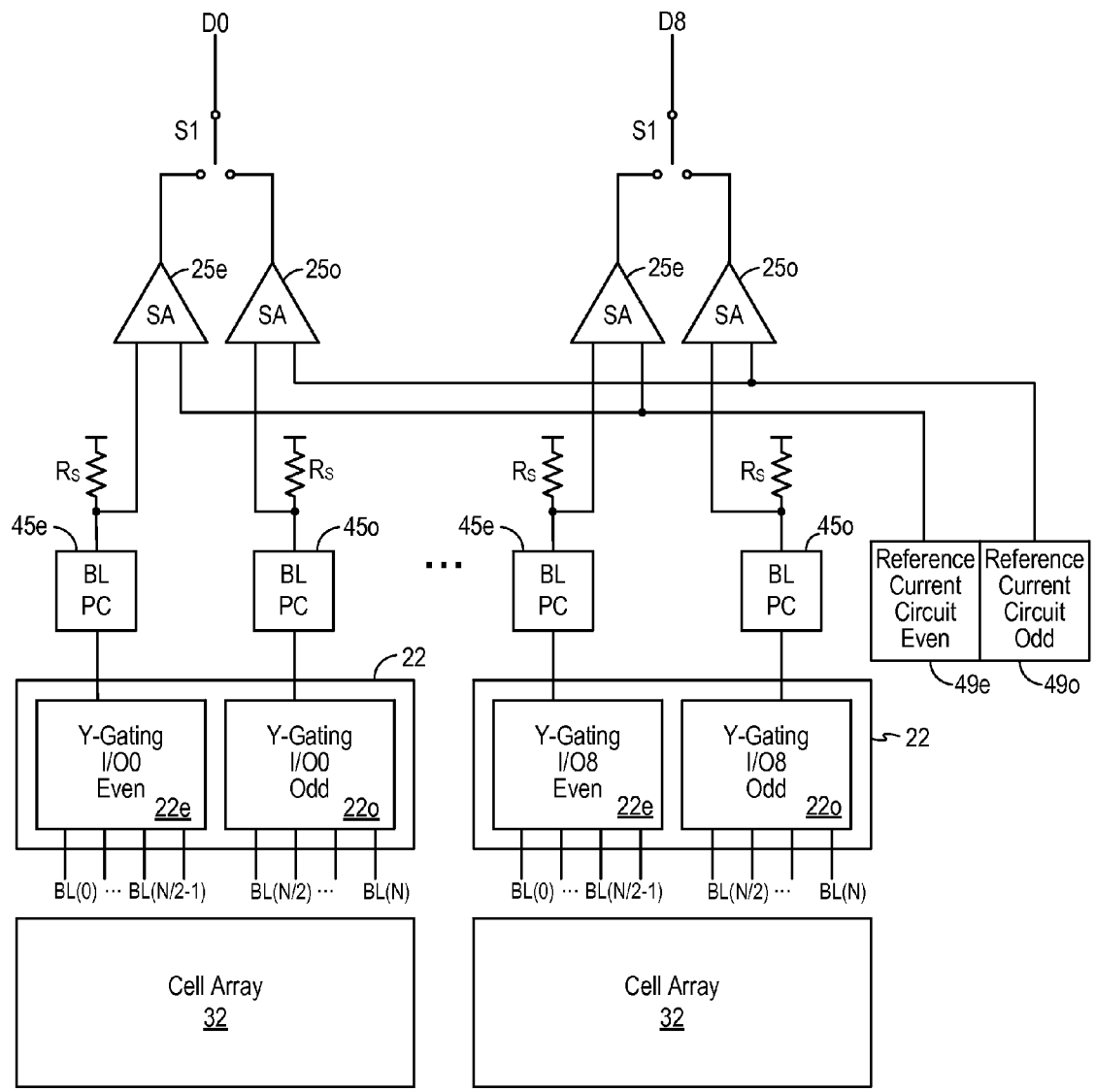
FIG. 10 is a block diagram illustrating a configuration of a flash memory device for implementing the sequential read method in alternate embodiments of the present invention.

FIG. 10 is a block diagram illustrating a configuration of a flash memory device for implementing the sequential read method in alternate embodiments of the present invention. Referring to FIG. 10, a flash memory device of the present invention configured to implement the sequential read method uses a pair of bit-line precharge circuits and a pair of sense amplifiers for each I/O. Accordingly, at each I/O, each bit-line precharge circuit 45e, 45o is coupled to a dedicated sense amplifier 25e, 25o. A switch S5 is coupled to the output terminals of the pair of sense amplifiers 25e, 25o. The switch S5 switches between read cycles to connect the sense amplifier output terminal associated with the current address to data output node. With the switch being provided after the sense amplifier, no switches are required at the input to the sense amplifiers.

Referring to FIG. 1, the flash memory device 10 includes an address latch 16 for latching and storing the current address being accessed. When the flash memory device 10 implements the sequential read method, the overlapping read cycles means that while the memory cell at the current address is being sensed, the next address is loaded to start the bit-line precharge. Accordingly, the flash memory device is provided with a first address latch to latch the current address being accessed and a second address latch to latch the next address for advance precharge.

Figure 11:
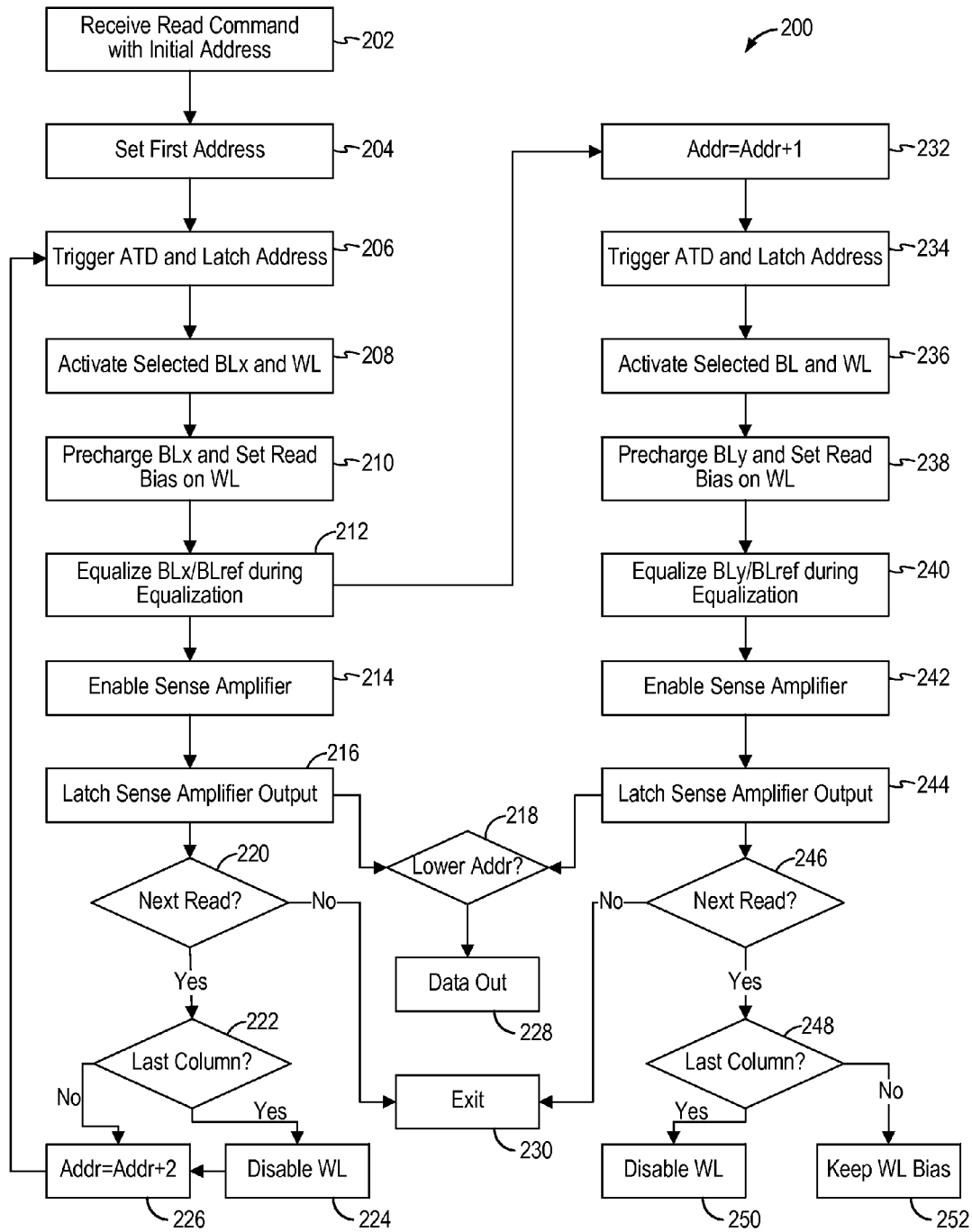
FIG. 11 is a flowchart illustrating the sequential read method in embodiments of the present invention.

FIG. 11 is a flowchart illustrating the sequential read method in embodiments of the present invention. Referring to FIG. 11, a sequential read method 200 starts when a read command for a sequential read mode is receives (202). The read command is accompanied by the initial memory cell address. The method 200 then sets the initial address as the first address (204). With the first address arriving, the address transition detection signal ATD is triggered and the first address is latched as the current address (206). The method 200 then activates the selected bit-line and word-line (208). The method 200 then precharge the selected bit-line and set the read bias voltage on the selected word-line (210). The method 200 then equalizes the selected bit-line BLx and the reference bit-line BLref (212).

At this point, the method 200 can initiate the overlapping read cycle to perform advance precharge. Thus, while method 200 continues with enabling the sense amplifier (214) and latching the sense amplifier output (216), the method 200 also proceeds to increment the current address to generate the next consecutive address as the advance address (232). With the advance address generated, the address transition detection signal ATD is triggered and the advance address is latched as the next address (234). The method 200 then activates the bit-line and word-line associated with the advance address (236). The method 200 then precharge the selected bit-line and set the read bias voltage on the selected word-line (238). The method 200 then equalizes the selected bit-line BLy and the reference bit-line BLref (240). The method 200 continues with enabling the sense amplifier (242) and latching the sense amplifier output (244). The method 200 selects the lower address to output data (218) and the data read out is provided as the output data (228).

Meanwhile, at the current address, the method 200 determines if there is another address to be read (220). When there are remaining addresses, the method determines if the current address is the last column in the cell array (222). If the current address is not the last column in the cell array, the method 200 continues with incrementing the current address by two (226) and the method repeats at 206 where the ATD signal is triggered. If the current address is the last column in the cell array, then the method 200 disable the current word-line (224) and continues with incrementing the current address by two (226) and the method repeats at 206 where the ATD signal is triggered.

Similarly, when the advance address has been sensed and output data latched, the method 200 determines if there is another address to be read (246). When there are remaining addresses, the method determines if the current address is the last column in the cell array (248). If the current address is not the last column in the cell array, the method 200 keeps the word-line bias (252). If the current address is the last column in the cell array, then the method 200 disable the current word-line (250).

Note that in method 200 described above, the word-line is activated and the read bias is set for each address. In actual practice, the word-line is activated for the first address in the row and then remain activated or biased for all the address in the same row. A new word-line is activated and biased only when the address moves to the next row.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method in a non-volatile memory device including an array of memory cells, the method for performing a sequential read operation from a plurality of memory cells having consecutive memory cell addresses, the method comprising:
    detecting a first address transition relating to a first memory cell address at the start of a first read cycle;
    activating a first word-line associated with the first memory cell address;
    selecting a first bit-line associated with the first memory cell address;
    precharging the first bit-line and a first reference bit-line;
    equalizing the first bit-line and the first reference bit-line;
    after precharging and equalizing the first bit-line, enabling the sensing of the first bit-line during the first read cycle and detecting, during the first read cycle, a second address transition relating to a second memory cell address for a second read cycle, the second memory cell address being a next address following the first memory cell address;
    selecting, during the first read cycle, a second bit-line associated with the second memory cell address;
    precharging, during the first read cycle, the second bit-line and a second reference bit-line;
    equalizing, during the first read cycle, the second bit-line and the second reference bit-line;
    latching, at an end of the first read cycle, a first output data associated with the first memory cell address; and
    after precharging and equalizing the second bit-line, enabling the sensing of the second bit-line during the second read cycle.

2. The method of claim 1, wherein selecting, during the first read cycle, the second bit-line associated with the second memory cell address comprises selecting the second bit-line being a bit-line at a beginning of a second word-line of the array of memory cells, the method further comprising:
    activating, during the first read cycle, the second word-line associated with the second memory cell address.

3. The method of claim 1, wherein activating the first word-line associated with the first memory cell address comprises keeping a word-line bias on the first word-line in response to the first word-line being activated for a previous memory cell address.

4. The method of claim 1, wherein after precharging and equalizing the second bit-line, enabling the sensing of the second bit-line during the second read cycle and detecting, during the second read cycle, a third address transition relating to a third memory cell address for a third read cycle, the third memory cell address being a next address following the second memory cell address.

5. The method of claim 1, wherein detecting the second address transition relating to the second memory cell address for a second read cycle comprises:

detecting the second address transition relating to the second memory cell address at a second half of the first read cycle.

6. The method of claim 1, wherein the array of memory cells comprises two partitions of the array, a first partition being associated with a first word-line segment and a second partition being associated with a second word-line segment, and wherein activating the first word-line associated with the first memory cell address comprises activing a first word-line segment associated with the first memory cell address.

7. The method of claim 6, wherein selecting, during the first read cycle, the second bit-line associated with the second memory cell address comprises selecting the second bit-line being a bit-line at a beginning of the second word-line segment, the method further comprising:
  activating, during the first read cycle, the second word-line segment associated with the second memory cell address.

8. A non-volatile memory device, comprising:
  a two-dimensional array of non-volatile memory cells, each memory cell being adapted to store one bit of data, each memory cell being accessed by a word-line and a bit-line;
  a word-line driver configured to select one of a plurality of word-lines in the array; and
  a bit-line selection circuit configured to select one of a plurality of bit-lines in the array;
  a bit-line precharge circuit configured to precharge a selected bit-line;
  a reference current generation circuit configured to generate a reference current;
  a sense amplifier configured to receive a signal indicative of the reference current and further to receive a signal indicative of a bit-line current in response to a memory cell being selected for access by activating the respective word line and the respective bit-line, the sense amplifier being configured to sense the difference between the bit-line current flowing in the selected memory cell and the reference current and to generate an output signal indicative of the difference,
  wherein in response to the array of memory cells being accessed in a sequential read mode to read data from a plurality of memory cells having consecutive memory cell addresses, a first memory cell address is detected in a first read cycle, the bit-line associated with the first memory cell address and a first reference bit-line being precharged and equalized during the first read cycle, and after the precharging and equalizing of the first bit-line, the sense amplifier senses the bit-line current on the first bit-line and a second memory cell address is detected during the first read cycle, the second memory cell address being a next address following the first memory cell address for a second read cycle, the bit-line associated with the second memory cell address and a second reference bit-line being precharged and equalized during the first read cycle.

9. The non-volatile memory device of claim 8, further comprising:
  in response to detecting the first memory cell address, activating a first word-line associated with the first memory cell address.

10. The non-volatile memory device of claim 9, wherein the bit-line associated with the second memory cell address comprises a bit-line at a beginning of a second word-line of the array of memory cells and in response to detecting the second memory cell address, activating, during the first read cycle, the second word-line associated with the second memory cell address.

11. The non-volatile memory device of claim 9, wherein activating the first word-line associated with the first memory cell address comprises keeping a word-line bias on the first word-line in response to the first word-line being activated for a previous memory cell address.

12. The non-volatile memory device of claim 8, wherein after precharging and equalizing the second bit-line, the sense amplifier senses the bit-line current on the second bit-line and a third address transition relating to a third memory cell address is detected during the second read cycle, the third memory cell address being a next address following the second memory cell address for a third read cycle.

13. The non-volatile memory device of claim 8, wherein the second address transition relating to the second memory cell address is detected at a second half of the first read cycle.

14. The non-volatile memory device of claim 9, wherein the array of memory cells comprises two partitions of the array, a first partition being associated with a first word-line segment and a second partition being associated with a second word-line segment, and wherein activating the first word-line associated with the first memory cell address comprises activing a first word-line segment associated with the first memory cell address.

15. The non-volatile memory device of claim 14, wherein the bit-line associated with the second memory cell address comprises a bit-line at a beginning of a second word-line segment of the array of memory cells and in response to detecting the second memory cell address, activating, during the first read cycle, the second word-line segment associated with the second memory cell address.

* * * * *